United States Patent [19]

Egermeier et al.

[11] Patent Number: 5,005,519
[45] Date of Patent: Apr. 9, 1991

[54] REACTION CHAMBER HAVING NON-CLOUDED WINDOW

[75] Inventors: John C. Egermeier; Janet Ellzey, both of Vienna, Va.; Delroy Walker, Mt. Rainier, Md.

[73] Assignee: Fusion Systems Corporation, Rockville, Md.

[21] Appl. No.: 492,454

[22] Filed: Mar. 14, 1990

[51] Int. Cl.$^5$ .............................................. C23C 16/48
[52] U.S. Cl. ............................. 118/722; 118/50.1; 118/620; 427/53.1; 427/54.1
[58] Field of Search ................. 118/722, 50.1, 620; 427/53.1, 54.1

[56] References Cited

U.S. PATENT DOCUMENTS 4,435,445  3/1984  Allred .......................... 427/54.1

FOREIGN PATENT DOCUMENTS 0159980  9/1984  Japan .......................... 118/724

Primary Examiner—Richard Bueker
Attorney, Agent, or Firm—Pollock, Vande Sande & Priddy

[57] ABSTRACT

A reaction chamber for performing a chemical vapor deposition process wherein the window through which the light must pass is prevented from becoming clouded. The chamber is divided by baffles into a reactant zone, a buffer zone, and a window zone, and the momentum flux densities of the gases flowing in the respective zones are about matched. Additionally, discontinuities are provided on the walls of the reactor to impede diffusion of the reactant gas towards the window.

17 Claims, 3 Drawing Sheets

REACTION CHAMBER HAVING NON-CLOUDED WINDOW

The present invention is directed to a reaction chamber for performing light-assisted vapor deposition, and particularly to such a chamber wherein the window through which the light must pass is prevented from becoming cloudy.

Chemical vapor deposition processes in general are well known, and are used extensively in the manufacture of integrated circuits. The object of such processes is to deposit a layer of a substance on a substrate, which substance to be deposited is introduced as a component of a gas molecule which typically is passed over the substrate while it is heated to a relatively high temperature (e.g. 400-600 degrees C.). The heat of the substrate cracks the gas molecule, liberating the desired constituent to form a deposit.

While such vapor deposition processes have been useful in the manufacture of integrated circuits, a serious problem which has limited their usefulness has been the requirement of heating the substrate to a high temperature. Thus, the necessity for high temperatures has caused various problems including interdiffusion of the different layers of the integrated circuit, generation of material defects, and the occurrence of undesired stresses in the materials of the integrated circuit.

In order to alleviate the problems caused by high temperatures, a process known as photo-assisted chemical vapor deposition has been developed. In this process, the substrate is irradiated with light while it is heated, with the result that significantly lower temperatures (e.g., 100-200 degrees C. lower) can be used. For this purpose, UV light has been shown to have good process potential at low cost.

To date, photo-assisted chemical vapor deposition has not been developed to its potential because of a problem with window clouding. That is, in a typical process, ultraviolet light is directed through a window in a reactor so as to be incident on the substrate. However, it is found that the material to be deposited on the substrate also tends to be deposited on the window, thus rendering it opaque. For example, a review of the literature on the subject of the UV photo-assisted growth of the compound HgCdTe reveals that light intensity has been an uncontrollable variable in most or all efforts due to clouding of the window. This problem is especially difficult to deal with if the process is performed at or near atmospheric pressure because the usual methods of protecting the inside of a window under vacuum do not work well. Thus, in order to effectively maintain window transmission over many deposition cycles, it is necessary to absolutely prevent any reactant molecules from coming near the window where they could deposit as a condensate or as a solid deposit from gas phase or surface nucleation. This requirement is compounded by the need to make the window as close as possible to the substrate because light power is attenuated according to the square of the distance from the source. It is to the solution of this problem that the present invention is directed.

The typical prior art approach, which for example is embodied in Allred et al. U.S. Pat. No. 4,435,445, is to flow a stream of inert gas past the window. Notwithstanding the presence of such stream of gas adjacent the window, it is found that chemicals deposit on the window and that in too short a time it becomes clouded.

It is therefore the object of the present invention to prevent the window in a photo-assisted vapor deposition reaction chamber from becoming clouded, or at least to substantially slow clouding down to the point where the vapor deposition process is commercially useful.

In accordance with the invention, a reaction chamber is provided which has a window for allowing the passage of light. A first stream of gas having a reactant is flowed past a substrate in the chamber, and a second stream of gas is flowed past the window. Additionally, the chamber is provided with means for inhibiting the flow of reactant containing gas from the first stream towards the window, which typically comprises means which is effective to lengthen the path between the reactant containing gas and the window. For example, such means may include discontinuous baffles as well as discontinuities in the chamber walls. In the preferred embodiment, two baffles are employed to divide the space in the reactor into a reactant zone, a buffer zone, and a window zone, wherein the zones are accessible to each other only through openings in the respective baffles which are in line with the window and substrate. Gas streams are caused to flow in the respective zones, and thus reactant-containing gas which reaches the buffer zone may be swept away by the buffer stream before reaching the window zone. Additionally, in accordance with a further aspect of the invention, the momentum flux densities of the gas streams in the respective zones are arranged to be about the same. In this regard, it has been determined that when the momentum flux densities are approximately matched, convective mixing between the streams at the respective baffle openings is at a minimum, and less of the reactant stream tends to move towards the window.

The invention will be better understood by referring to the accompanying drawings in which.

Figure 1:
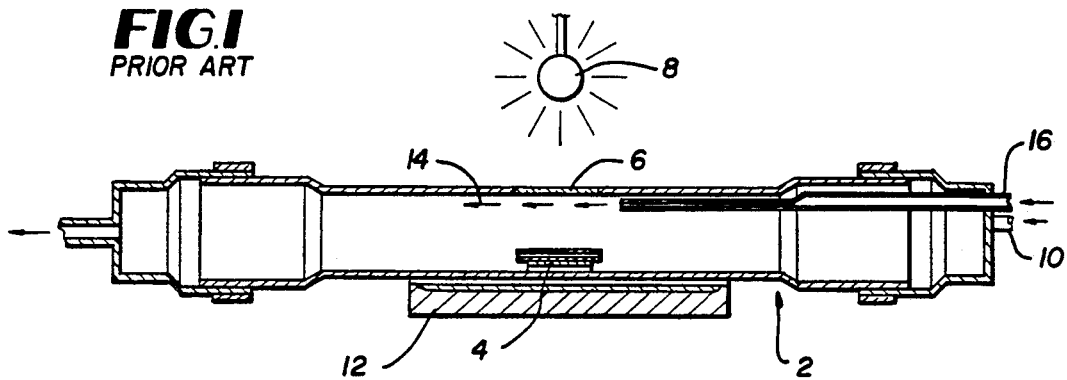
FIG. 1 shows a prior art apparatus for keeping the window in a photo-assisted vapor deposition reactor from becoming cloudy.

As mentioned above, FIG. 1 illustrates a prior art approach to keeping the window in a reaction chamber from becoming clouded. Referring to the Figure, reactor 2 is used to deposit a reactant or substrate 4, while the substrate is irradiated through transparent reactor portion 6 with light source 8. The reactant containing gas is fed to the reaction chamber at inlet 10, and flows over the substrate 4 while the substrate is heated with heater 12 and irradiated with light source 8. To keep the window area of the reactor from having reactant deposited on it and thus becoming cloudy, a stream of inert gas 14, which is fed through inlet 16, is flowed past the window.

However, notwithstanding the presence of window gas stream 14, it is found that the prior art arrangement of FIG. 1 is not effective to keep the window from becoming cloudy over a long enough period time.

Figure 2:
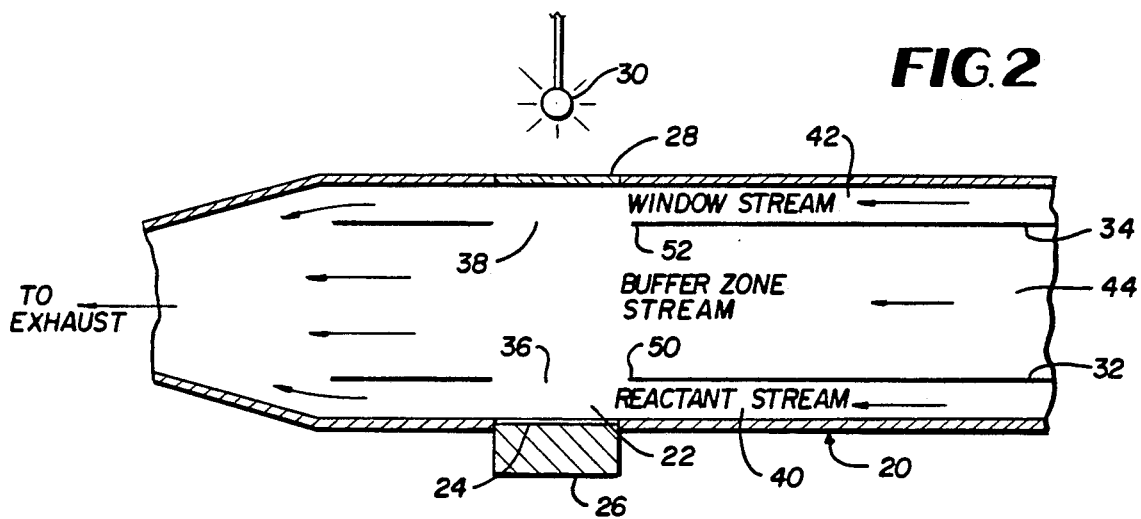
FIG. 2 shows an embodiment of the present invention for keeping the window in a photo-assisted vapor deposition reactor from becoming cloudy.

Referring to FIG. 2, an embodiment which employs the present invention is depicted. Reaction chamber 20 is provided, which is generally elongated and is made of metal or ceramic. There is access to the chamber at area 22 for inserting the substrate 24 to be processed, and the chamber is provided with a mechanical means for holding the substrate in place. Further, chuck 26 is provided for applying heat to the substrate.

The reaction chamber 20 is provided with a window 28, for example made of quartz, through which ultraviolet or other radiation is directed. Lamp 30 is also shown in the Figure, which emits the ultraviolet or other radiation which assists in the gas deposition process.

The reactor is provided with two baffles 32 and 34, which for example, may be flat sheets of metal. Baffles 32 and 34 have respective openings 36 and 38 in the area between window 28 and substrate 24. The provision of baffles 32 and 34 divides the interior of the reactor into reactant zone 40, window zone 42, and buffer zone 44, wherein the buffer zone may preferably be larger than the other zones.

In the operation of the reactor, a gas is fed through each of the zones, so that separate reactant, window, and buffer zone streams are established. The reactant stream will contain the reactant which is to be deposited on substrate 24 while the window stream traverses the area in front of window 28, tending to sweep reactant which may have entered this zone away from the window.

It is seen that the provision of the baffles makes it more difficult for reactant gas to diffuse towards the window, since the path which the reactants must follow to reach the window is lengthened, and the approach angle is more limited. Further, reactant which succeeds in reaching the buffer zone stream is swept past the baffle openings by the momentum of the buffer stream, so as to be prevented from reaching the window stream. While the substrate is illustrated at a position directly opposite the window, it could also be located to one side of the window.

In general, two processes contribute to the unwanted movement of reactants towards the inside surface of the window. These are diffusion and convection. The reactor shown in FIG. 2 minimizes diffusion by the baffle structure discussed above, and by wall discontinuities which are discussed below in connection with FIG. 5.

In accordance with the invention, convection is minimized by the provision of the baffles, and by matching the momentum flux densities of the respective streams. That is, referring to FIG. 2, at baffle points 50 and 52, local pressure differences tend to result in convective mixing of the streams in the area of the baffle openings. However, it has been determined that minimal convective mixing will occur when the momentum flux densities of the respective streams are approximately matched, i.e., where $K_1 \rho_R V_R \approx \rho_B V_B$ and
$K_2 \rho_B V_B \approx \rho_W V_W$ where $K_1$, $K_2$ are constants determined by reactor geometry, temperature and flow rate
R = density of carrier and reactant gas mixture
B = density of buffer stream gas
W = density of window stream gas and $V_R$ = velocity of reactant stream
$V_B$ = velocity of buffer stream
$V_W$ = velocity of window stream Thus, if one stream consisting of a heavy gas meets another stream consisting of a lighter gas, minimal convective mixing will occur at some combination of velocities where the lighter gas is moving faster. So long as the flow is laminar, it has been observed that this will occur when the momentum flux densities of the streams are about matched.

Figure 3:
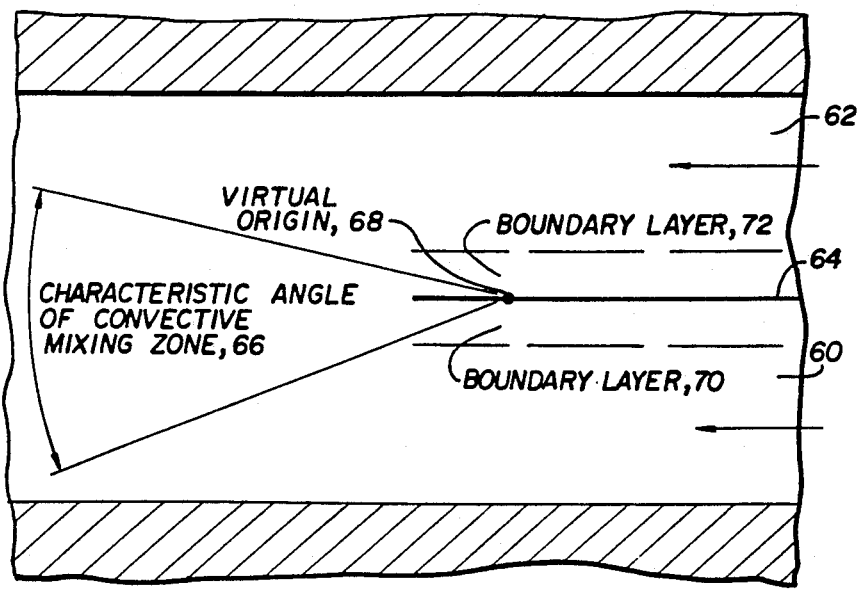
FIG. 3 is a pictorial diagram which illustrates the convective mixing of two gases at a boundary.
Figure 4:
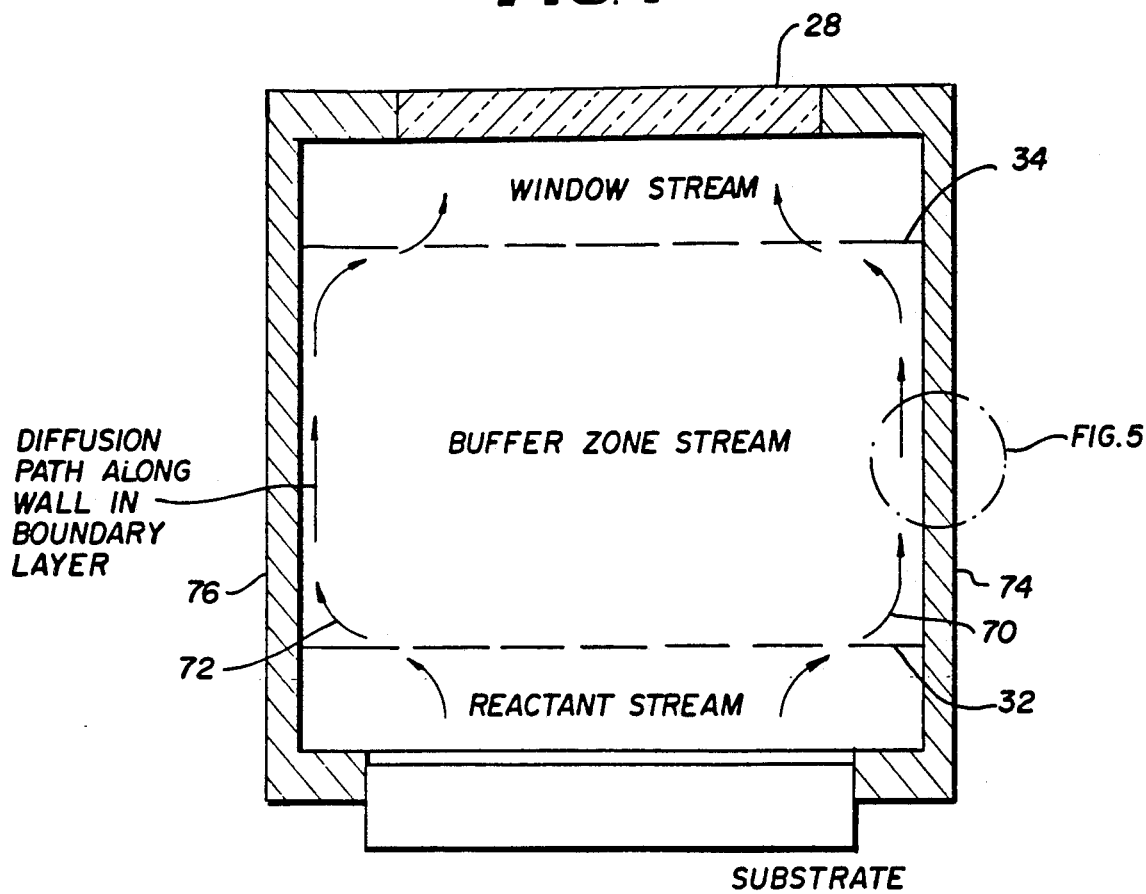
FIG. 4 is a pictorial diagram which illustrates how diffusion occurs along the walls of the reactor.

FIG. 3 is a detailed explanatory illustration of the convective mixing of two parallel gas streams 60 and 62 in laminar flow after the end of separation by a thin, smooth barrier 64. The shape of the mixing zone can be characterized by the angle 66, and this angle is minimized for different gas densities when the momentum flux of the two streams are nearly matched. The angle has a virtual origin 68, which is located before the confluence of the two streams. The distance to this point is controlled by the characteristics of the boundary layers 70 and 72, and minimizing this distance is helpful to delay the onset of mixing. This can be achieved by adjustment of the flow rate and also by shrinking the flow channels perpendicular to the baffle to minimize the boundary layer dimension. Additionally it appears that convection control benefits if the baffle is thin, smooth, and flat.

A substantial part of the diffusion of the reactant gases tends to occur along the walls of the reactor, and to impede this from occurring, the walls are provided with discontinuities. Thus, referring to FIG. 5, which is a cross-sectional view of the reactor shown in FIG. 2, diffusion paths 70 and 72 along reactor side walls 74 and 76 are depicted.

Figure 5:
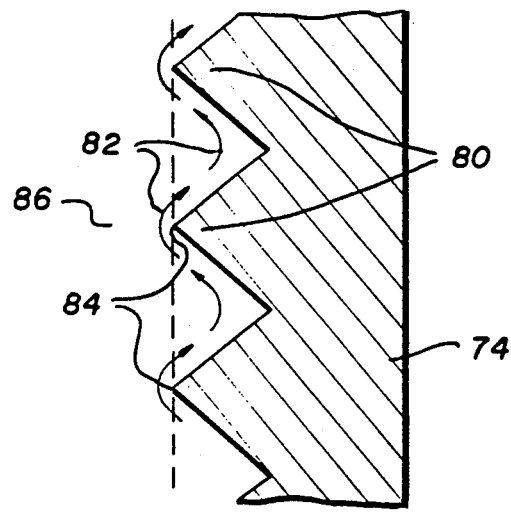
FIG. 5 is a pictorial diagram which illustrates how discontinuities which are present in the walls of the reactor of an embodiment of the present invention impede diffusion.

As shown in FIG. 5, to curtail the diffusion, the side walls of the reactor are provided with triangular grooves 80, which run parallel to the flow direction of the gases in the reactor. As shown in the Figure, the boundary layer flow 82 is confined to the grooves, which slows down the diffusion along the walls. The peaks 84 jut out beyond the boundary layer into the flow field 86. In the boundary layer, diffusion can easily dominate over convection to transport reactants along the walls towards the window. The grooves weaken this mechanism by lengthening the path and forcing molecules out of the boundary layer and into the flow stream at each peak. While triangular grooves serve as the wall discontinuities in the preferred embodiment, it is noted that other types of wall discontinuities may be utilized to the same end, and are within the scope of the invention.

In the selection of specific gases and flow velocities for the reactor, it is noted that the process to be performed dictates to some extent what the reactant and carrier gas flow will be. With the reactant stream composition and velocity fixed by the process, the buffer zone stream can be adjusted to achieve an optimal value for the mixing angle with the reactant stream. Then, with the buffer stream fixed, the window stream can be adjusted to minimize the mixing angle between itself and the buffer stream.

In accordance with another embodiment of the invention, instead of matching the momentum flux densities of the window and buffer streams, the momentum flux density of the window stream is intentionally made to be greater than that of the buffer stream, so as to skew any reactant away from the window. This is another approach to convection control which may help to impede clouding of the reactor window, and this is where the constants $K_1$, and $K_2$ come into play.

In an actual reactor which was built for the epitaxial growth of mercury-cadmium-telluride, the carrier gas for the reactants was hydrogen. The buffer stream is the largest and uses the most gas, and its composition, which was dictated by cost considerations, was nitrogen. The composition of the window stream was hydrogen.

Once the gases are selected, the flow rates are determined so as to match the respective momentum flux densities. Mass flow controllers can then be used to maintain optimum conditions at different reactant flow rates and compositions using the established mass flow ratios This provides a useful control feature in that source vapor pressures can be varied, dopant added, and other sudden or gradual changes can be effected, and the corresponding flow rates can be predicted and continuously adjusted by the controlling software.

Figure 6:
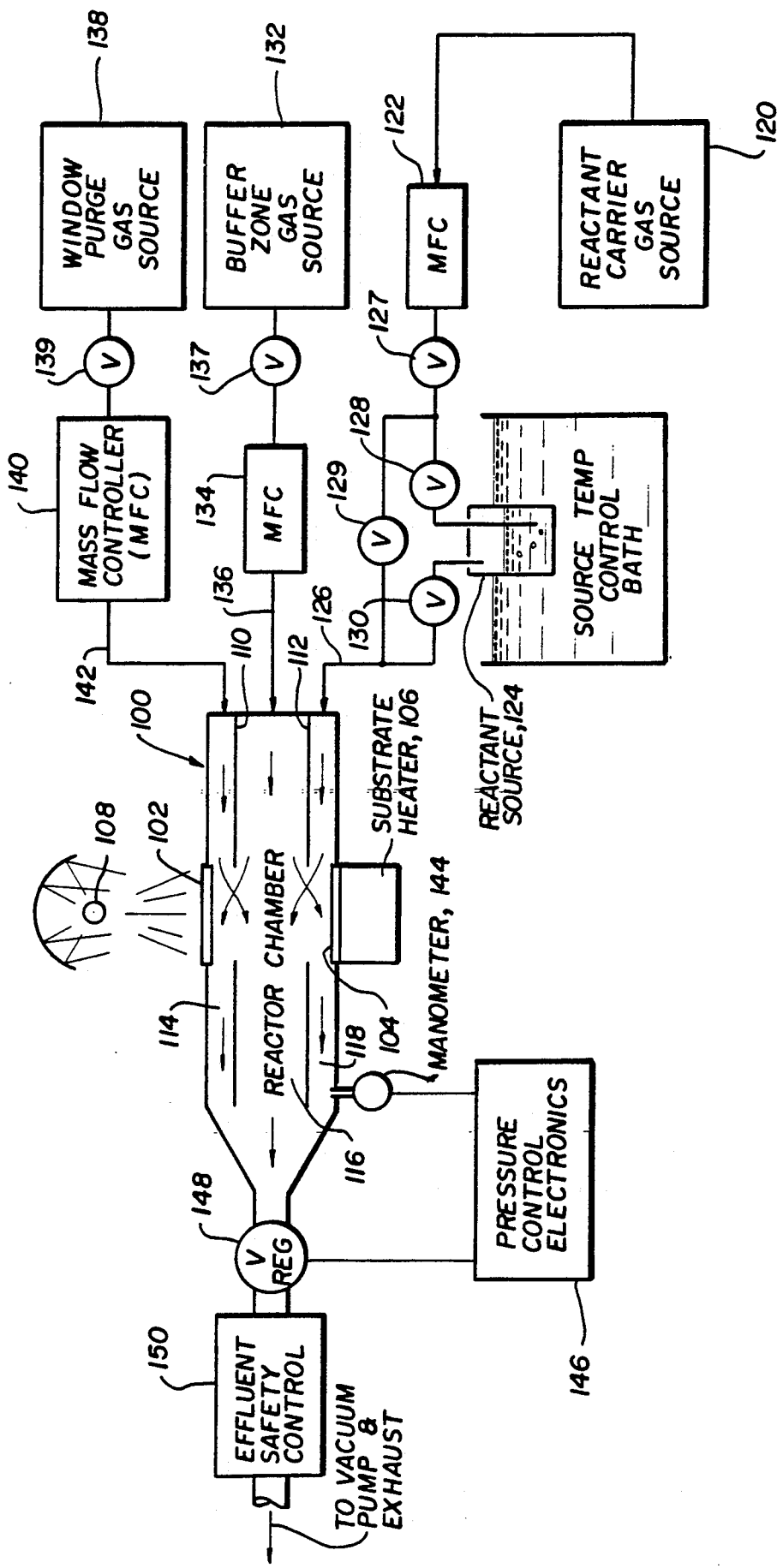
FIG. 6 shows a photo-assisted vapor deposition system which utilizes the present invention.

Referring to FIG. 6, a system employing the present invention is illustrated. A reactor 100 is provided, which has window 102, and substrate 104 mounted therein. A substrate heater 106 is provided, as is a UV source 108 for irradiating the substrate through the window. Additionally, baffles 110 and 112 are provided for dividing the interior of the reactor into window zone 114, buffer zone 116, and reactant zone 118.

A reactant carrier gas source 120 is provided, and the flow of such gas is controlled by mass flow controller 122. A reactant source 124 is provided, and the mixture of carrier and reactant gases is fed to the reactor via conduit 126. Buffer zone gas source 132 is also provided, and it flows through valve 137, and is metered by mass flow controller 134, which feeds the correct amount of gas through conduit 136 to the buffer zone of the reaction chamber. Similarly, window zone gas source 138 is provided, and mass flow controller 140 controls the flow of this gas through conduit 142 to the window zone of the reaction chamber.

Manometer 144 is provided, the output of which is fed to pressure control electronics 146 for controlling pressure control valve 148. The specific pressure which is employed will depend upon the particular process. Finally, effluent safety control 150 is present, before the output gases are exhausted from the system.

EXAMPLE

A reactor was built to effect the epitaxial growth of mercury-cadmium-telluride. The reactor was made of stainless steel and the baffles of thin spring steel sheet. The reactor was 14" in length, and rectangular in cross-section as shown in FIG. 5, with dimensions of 3.5" and 2.75". A substrate of Cd Te or GaAs was mounted in the reactor and was heated to 300 degrees celcius during the process. The reactant stream was composed of the reactants dimethyl cadmium and dimethyl tellurium in the carrier hydrogen while the buffer stream was composed of nitrogen, and the window stream was composed of hydrogen. The flow rates of the reactant carrier gases, buffer gas, and window streams were arranged to be total 200 sccm, 1000 sccm, and 400 sccm, respectively.

At the end of a two-hour growth cycle, the window maintained 90% transmission.

An improved reactor for performing photo-assisted vapor deposition has thus been disclosed. While the invention has been illustrated in connection with a chemical vapor deposition process, it should be understood that it has more general applicability, and may be used to prevent window clouding whenever a photo reactable gas is deposited on a substrate.

Thus, it should be appreciated that while the invention has been disclosed in connection with illustrative embodiments, its scope is to be limited only by the claims appended hereto as well as equivalents.

We claim:

1. A reactor for performing a process in which a photoreactable gas is deposited on a substrate, comprising,
   an enclosure having a window for allowing the passage of radiation to which said photoreactable gas is responsive,
   the enclosure having two baffles therein which extend across the enclosure from wall to wall for dividing the space therein into three zones, the zone nearest the window being the window zone, the zone between the baffles being the buffer zone, and the other zone being the reactant zone,
   each of said baffles having an opening in line with the window and the enclosure being adapted for receiving the substrate in the reactant zone at a position in line with the window and the baffle openings,
   means for causing gas having a reactant to be deposited on said substrate to flow past said substrate in said reactant zone,
   means for causing gas to flow in said buffer zone, and
   means for causing gas to flow past said window in said window zone.

2. The reactor of claim 1 wherein the momentum flux density of the gas flowing in the reactant zone is arranged to be about the same as the momentum flux density of the gas flowing in the buffer zone.

3. The reactor of claim 1 wherein the momentum flux density of the gas flowing in the window zone is arranged to be about the same as the momentum flux density of the gas flowing in the buffer zone.

4. The reactor of claim 2 wherein the momentum, flux density of the gas flowing in the window zone is arranged to be about the same as the momentum flux density of the gas flowing in the buffer zone.

5. The reactor of claim 1 wherein the momentum flux density of the gas flowing in the window zone is arranged to be substantially greater than the momentum flux density of the gas flowing in the buffer zone so as to skew such gas away from the window.

6. The reactor of claim 1 wherein the buffer zone is larger than the other zones.

7. The reactor of claim 1 wherein interior wall surfaces of the reactor have discontinuities.

8. The reactor of claim 7 wherein said discontinuities are grooves having peaks which extend beyond the boundary layer of the gases which may be diffusing therealong.

9. The reactor of claim 8 wherein the gas flowing in the reactant and window zones is primarily hydrogen, while the gas flowing in the buffer zone is primarily nitrogen.

10. A reactor for performing a process in which a photoreactable gas is deposited on a substrate, comprising,
    an enclosure having a window for allowing the passage of radiation to which said photoreactable gas is responsive,
    the enclosure having two baffles therein which extend across the enclosure from wall to wall for dividing the space therein into three zones, the zone nearest the window being the window zone, the zone between the baffles being the buffer zone, and the other zone being the reactant zone, each of said baffles having an opening in line with the window and the enclosure being adapted for receiving a substrate in the reactant zone at a position in line with the window and the baffle openings, means for causing gas having a reactant to be deposited on said substrate to flow past said substrate in said reactant zone, said flowing gas having a certain momentum flux density, means for causing gas to flow in said buffer zone, the momentum flux density of the gas flowing in the buffer zone being about the same as the momentum flux density of the gas flowing in the reactant zone, and means for causing gas to flow in the window zone, the momentum flux density or the gas flowing in the window zone being about the same as the momentum flux density of the gas flowing in the buffer zone.

11. The reactor of claim 10 wherein the interior walls of the reactor include means for inhibiting the diffusion of gases flowing along the surfaces of such walls.

12. A reactor for performing a process in which a photoreactable gas is deposited on a substrate, comprising, an enclosure having a window for allowing the passage of radiation to which said photoreactable gas is responsive, the enclosure having two baffles therein which extend across the enclosure from wall to wall for dividing the space therein into three zones, the zone nearest the window being the window zone, the zone between the baffles being the buffer zone, and the other zone being the reactant zone, each of said baffles having an opening in line with the window and the enclosure being adapted for receiving a substrate in the reactant zone at a position in line with the window and the baffle openings, means for causing gas having a reactant to be deposited on said substrate to flow past said substrate in said reactant zone.

means for causing gas to flow in said buffer zone, said flowing gas having a certain momentum flux density, and means for causing gas to flow in the window zone, the momentum flux density of the gas flowing in the window zone being greater than the momentum flux density of the gas flowing in the buffer zone.

13. The reactor of claim 12 wherein the momentum flux density of the gas flowing in the reactant zone is about the same as the momentum flux density of the gas flowing in the buffer zone.

14. A reactor for performing a process in which a photoreactable gas is deposited on a substrate, comprising, an enclosure having a window for allowing the passage of radiation to which said photoreactable gas is responsive, the enclosure being adapted for receiving a substrate at a location at which said radiation may be received, a first stream of gas having a reactant to be deposited flowing past the location where said substrate is received, a second stream of gas flowing past said window, and means in said enclosure for inhibiting gas from said first stream from reaching said second stream and said window, said means for inhibiting comprising;

(a) baffle means for lengthening the path which gas from said first stream would follow to reach said window, and (b) discontinuities in the walls of the enclosure for lengthening said path.

15. A reactor for performing a process in which a photoreactable gas is deposited on a substrate, comprising, an enclosure in which said substrate is located during said process, said enclosure having a window for allowing the passage of radiation to which said photoreactable gas is responsive, the enclosure having two baffles therein which extend across said enclosure from wall to wall for dividing the space therein into three zones, each of said baffles having an opening in line with said window, and said enclosure being adapted for receiving said substrate at a position which is in line with said window and said baffle openings, and wherein the interior wall surfaces of the enclosure have discontinuities.

16. The reactor of claim 15 wherein the zone between the two baffles is larger than the other zones.

17. The reactor of claim 15 wherein said discontinuities are grooves.

* * * * *